(12) United States Patent
Puchner

(10) Patent No.: US 6,605,846 B2
(45) Date of Patent: Aug. 12, 2003

(54) SHALLOW JUNCTION FORMATION

(75) Inventor: Helmut Puchner, Santa Clara, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/268,736

(22) Filed: Oct. 10, 2002

(65) Prior Publication Data

US 2003/0045062 A1 Mar. 6, 2003

Related U.S. Application Data

(62) Division of application No. 09/670,448, filed on Sep. 26, 2000, now Pat. No. 6,486,064.

(51) Int. Cl.[7] .......................... H01L 29/76; H01L 29/94; H01L 31/082; H01L 31/119; H01L 31/113
(52) U.S. Cl. ..................... 257/368; 257/288; 257/369; 257/371
(58) Field of Search ................................ 257/288, 368, 257/369, 371

(56) References Cited

U.S. PATENT DOCUMENTS 6,486,064 B1 * 11/2002 Puchner ...................... 438/689
6,489,231 B1 * 12/2002 Kumar et al. ............... 438/627

* cited by examiner

*Primary Examiner*—Long Pham
(74) *Attorney, Agent, or Firm*—Luedeka, Neeley & Graham

(57) ABSTRACT

A method of forming junctions in a semiconductor substrate, where a gate dielectric layer is grown on the semiconductor substrate, a gate electrode layer is deposited on the gate dielectric layer, and a sacrificial layer is formed on the gate electrode layer. The sacrificial layer is patterned with a material to cover portions of the sacrificial layer and expose portions of the sacrificial layer. The exposed portions of the sacrificial layer are etched to remove the exposed portions of the sacrificial layer and expose portions of the gate electrode layer. The exposed portions of the gate electrode layer are etched to expose portions of the gate dielectric layer and form a gate electrode having exposed vertical faces. The sacrificial layer and the exposed portions of the gate dielectric layer are impregnated with a first species that inhibits diffusion of oxygen through the sacrificial layer and the exposed portions of the gate dielectric layer. The impregnation is accomplished using a process that does not impregnate a significant amount of the first species in the exposed vertical faces of the gate electrode. The impregnated sacrificial layer, the exposed vertical faces of the gate electrode, and the impregnated exposed portions of the gate dielectric layer are exposed to an oxidizing environment, causing oxide growth on at least the exposed vertical faces of the gate electrode, and thereby covering the vertical faces of the gate electrode with oxide sidewalls. However, the oxidizing environment does not cause significant oxide growth under the impregnated sacrificial layer and the impregnated exposed portions of the gate dielectric layer. A second species is impregnated through the impregnated exposed portions of the gate dielectric layer into portions of the semiconductor substrate that underlie the impregnated exposed portions of the gate dielectric layer. The impregnated second species forms junctions in the portions of the semiconductor substrate that underlie the impregnated exposed portions of the gate dielectric layer.

3 Claims, 3 Drawing Sheets

SHALLOW JUNCTION FORMATION

This is a divisional of application Ser. No. 09/670,448 filed Sep. 26, 2000 now U.S. Pat. No. 6,486,064.

TECHNICAL FIELD

This invention relates to the field of semiconductor processing. More particularly, this invention relates to a method for forming a shallow junction for an integrated circuit.

BACKGROUND OF THE INVENTION

As lateral integrated circuit device geometries continue to shrink, it often is desirable to commensurately shrink certain vertical geometries of the integrated circuits as well. As the vertical geometries shrink, or in other words as the various layers and structures become thinner, it tends to become increasingly important to control the processes by which the layers and structures are formed. This is because there tends to be less tolerance to variation in the thickness of a relatively thinner structure than there is to variation in the thickness of a relatively thicker structure.

For example, when fabricating integrated circuits such as complimentary metal oxide semiconductors, it is typically desirable to form the source and the drain regions with shallow junction depths in the semiconductor substrate. An oxide layer of from about one hundred angstroms to about two hundred angstroms in thickness is typically deposited over the surface of the semiconductor substrate at some point prior to the implant that forms the junctions, to protect the semiconductor substrate from damage during the implant. The sources and drains are commonly formed by implanting a dopant such as boron or arsenic, depending on the type of junction being formed. These species are typically implanted at an energy of about one thousand electron volts. At this energy, the dopants have a projected total implant depth of a few hundred angstroms. Thus, the thickness of the protective oxide layer plays a very significant part in determining the junction depth for sources and drains formed by the implant.

However, there are other design goals that compete with the design goal of maintaining a uniform and known thickness of the protective oxide layer. For example, a polysilicon gate electrode reoxidation process is typically conducted immediately after the polysilicon gate electrode is etched. The reoxidation process is primarily designed to grow oxide sidewalls, on the vertical faces of the polysilicon gate electrode, to protect the polysilicon gate electrode during subsequent processing. Unfortunately, the reoxidation process tends to also grow additional oxide at the interface between the semiconductor substrate and the protective oxide layer, thus increasing the thickness of the protective oxide layer by some amount. The additional thickness of the protective oxide layer effects the depth to which the dopant for the source and drain regions is implanted into the semiconductor substrate, as explained above.

Thus, there is a need for a method of forming junctions in a semiconductor substrate, where the thickness of the protective layer overlying the semiconductor substrate does not increase during the reoxidation of the gate electrode layer.

SUMMARY OF THE INVENTION

The above and other needs are met by a method of forming junctions in a semiconductor substrate, where a gate dielectric layer is deposited on the semiconductor substrate, a gate electrode layer is deposited on the gate dielectric layer, and a sacrificial layer is formed on the gate electrode layer. The sacrificial layer is patterned with a material to cover portions of the sacrificial layer and expose portions of the sacrificial layer. The exposed portions of the sacrificial layer are etched to remove the exposed portions of the sacrificial layer and expose portions of the gate electrode layer. The exposed portions of the gate electrode layer are etched to expose portions of the gate dielectric layer and form a gate electrode having exposed vertical faces.

The sacrificial layer and the exposed portions of the gate dielectric layer are impregnated with a first species that inhibits diffusion of oxygen through the sacrificial layer and the exposed portions of the gate dielectric layer. The impregnation is accomplished using a process that does not impregnate a significant amount of the first species in the exposed vertical faces of the gate electrode. The impregnated sacrificial layer, the exposed vertical faces of the gate electrode, and the impregnated exposed portions of the gate dielectric layer are exposed to an oxidizing environment, causing oxide growth on at least the exposed vertical faces of the gate electrode, and thereby covering the vertical faces of the gate electrode with oxide sidewalls. However, the oxidizing environment does not cause significant oxide growth under the impregnated sacrificial layer and the impregnated exposed portions of the gate dielectric layer.

A second species is impregnated through the impregnated exposed portions of the gate dielectric layer into portions of the semiconductor substrate that underlie the impregnated exposed portions of the gate dielectric layer. The impregnated second species forms junctions in the portions of the semiconductor substrate that underlie the impregnated exposed portions of the gate dielectric layer.

Thus, in this manner junctions with very controlled junction depths are formed in the semiconductor substrate. Because the gate dielectric layer is impregnated with the first species that inhibits diffusion of oxygen, the gate dielectric layer does not appreciably grow in thickness during the oxidation process by which the sidewalls on the gate electrode layer are formed. By maintaining the gate dielectric layer at a known thickness, the results of the process by which the second species is impregnated into the semiconductor substrate are more repeatable, and the junctions can be formed to a finely controlled depth within the semiconductor substrate.

In various preferred embodiments of the invention the semiconductor substrate is monocrystalline silicon, the gate dielectric layer is silicon oxide, the gate electrode layer is polysilicon, and the sacrificial layer is silicon oxide. Most preferably the first species is nitrogen that is impregnated to a concentration of between about three atomic percent and about twenty atomic percent. Also in the preferred embodiment, the impregnated exposed portions of the gate dielectric layer are cleaned prior to the step of impregnating the second species.

BRIEF DESCRIPTION OF THE DRAWINGS

Further advantages of the invention will become apparent by reference to the detailed description of preferred embodiments when considered in conjunction with the following drawings, which are not to scale so as to more clearly depict the details, wherein like reference characters designate like or similar elements throughout the several views, and wherein.

DETAILED DESCRIPTION OF THE INVENTION

Figure 1:
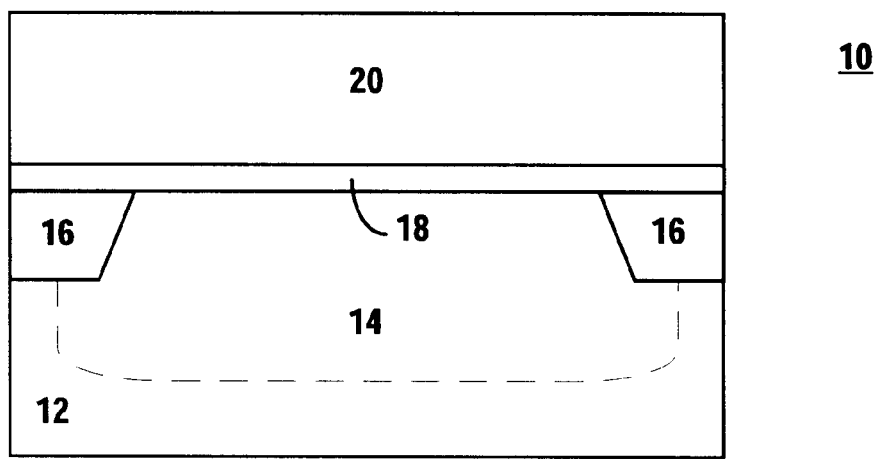
FIG. 1 is a cross sectional view of an integrated circuit having a semiconductor substrate covered with a gate dielectric layer, that is covered with a gate electrode layer.

Referring now to FIG. 1, there is depicted a portion of a semiconductor substrate 12, that has received some amount of processing to form various structures within and on top of the semiconductor substrate 12. As described herein, the specific example of a monocrystalline silicon substrate 12 is used. However, it is appreciated that this is by way of example only and that in various alternate embodiments substrates of other materials can be used. Further, the various specific embodiments presented in regard to the different structures that are formed are also given not by way of limitation, but by way of example, and various other embodiments are possible as well. As depicted in the figures, the invention is described herein with particular reference to one of either an NMOS or a PMOS integrated circuit 10, which forms a part of a larger CMOS integrated circuit.

As depicted in FIG. 1, isolation structures 16 have been formed in the semiconductor substrate 12. In the preferred embodiment, the isolations structures 16 are formed primarily of silicon oxide according to one or more of a variety of different methods, such as local oxidation of silicon or shallow trench isolation processes. A well 14 has also been formed in the semiconductor substrate 12. In the preferred embodiments, where the semiconductor substrate 12 is a silicon substrate, the well 14 is either an N doped well or a P doped well, depending upon the dopant type of the surrounding semiconductor substrate 12, whether it be P type or N type, respectively. The well 14 may be formed according to one or more of a variety of different methods, such as diffusion ion implantation.

A gate dielectric layer 18 is grown on the top surface of the semiconductor substrate 12. In the preferred embodiment the gate dielectric layer 18 is a layer of silicon oxide. As explained in more detail below, portions of the gate dielectric layer 18 are to be used for an insulating layer between a gate electrode that is to be formed and the semiconducting substrate 12 that underlies the gate electrode. The gate dielectric layer 18 is preferably grown to a thickness that is dependent at least in part to the type of source/drain implant that is to be performed. A low energy dopant implant typically uses a lower thickness of gate dielectric layer 18, in order to avoid dopants being trapped in the gate dielectric layer 18, and therefore unable to be activated in the semiconductor substrate 12.

In the preferred embodiment of an integrated circuit 10 in which a low energy dopant implant is to be accomplished, the gate dielectric layer 18 is grown to a thickness of between about ten angstroms and about two hundred angstroms, and most preferably about thirty-five angstroms.

The gate dielectric layer 18 is grown according to one or more different oxidation techniques, such as dry oxidation and wet oxidation, including methods to harden the gate dielectric layer 18 against boron penetration, such as a subsequent oxidation step in a NO ambient environment.

A gate electrode layer 20 is deposited on the top surface of the gate dielectric layer 18. In the preferred embodiment of the gate electrode layer 20 is a layer of polysilicon. In the preferred embodiments, the gate electrode layer 20 is deposited to a thickness of between about five hundred angstroms and about three thousand angstroms, and most preferably about eighteen hundred angstroms. The gate electrode layer is deposited according to one or more different deposition techniques, such as physical vapor deposition and chemical vapor deposition. One purpose of the gate electrode layer 20 is that it is eventually used to form the gate electrode for the integrated circuit 10.

Figure 2:
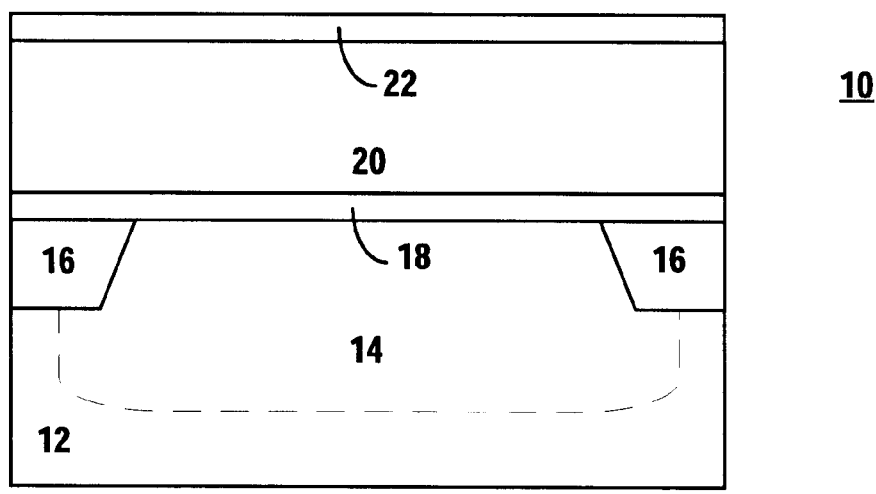
FIG. 2 is a cross sectional view of the integrated circuit of FIG. 1, where a sacrificial layer has been deposited.

As depicted in FIG. 2, a sacrificial layer 22 is deposited or grown on the top surface of the gate electrode layer 20. In the preferred embodiment the sacrificial layer 22 is a layer of silicon oxide. In the preferred embodiments, the sacrificial layer 22 is deposited to a thickness of between about thirty angstroms and about three hundred angstroms, and most preferably about one hundred angstroms. The sacrificial layer 22 is deposited or grown according to one or more different deposition or oxide growth techniques, such as physical vapor deposition, chemical vapor deposition, dry oxidation, and wet oxidation. One purpose of the sacrificial layer 22 is that it is eventually used to pattern and protect the gate electrode layer 20.

The sacrificial oxide layer 22 is patterned according to one or more of a variety of different methods. For example, in a preferred embodiment the sacrificial oxide layer 22 is patterned by overlaying it with a layer of photoresist that is cured, exposed, developed, and baked. The image patterned in the photoresist thus leaves portions of the sacrificial layer 22 exposed and other portions of the sacrificial layer 22 covered. The exposed portions of the sacrificial layer 22 are then etched to expose the gate electrode layer 20 in the portions of the gate electrode layer 20 that underlie the exposed and etched portions of the sacrificial layer 22.

The sacrificial layer 22 may be etched according to any one or more of a variety of different techniques. In one embodiment the sacrificial layer 22 is etched using an etchant that selectively etches the material of the sacrificial layer 22 at a significantly faster rate than it etches the material of the gate electrode layer 20. For example, in the embodiment where the sacrificial layer 22 is silicon oxide and the gate electrode layer 20 is polysilicon, a wet etch in an aqueous solution of hydrofluoric acid preferentially etches the silicon oxide sacrificial layer 22 at a rate that is significantly faster than the rate at which the solution etches the polysilicon gate electrode layer 20.

In alternate embodiments, the sacrificial layer 22 is etched using an etchant that etches both the sacrificial layer 22 and the gate electrode layer 20 at substantially the same rate, or at rates that are not so different that etching both the sacrificial layer 22 and the gate electrode layer 20 at the same time is impractical. For example, in one such embodiment both the sacrificial layer 22 and the gate electrode layer 20 are etched in one process step with a highly directional high density plasma etch.

Figure 3:
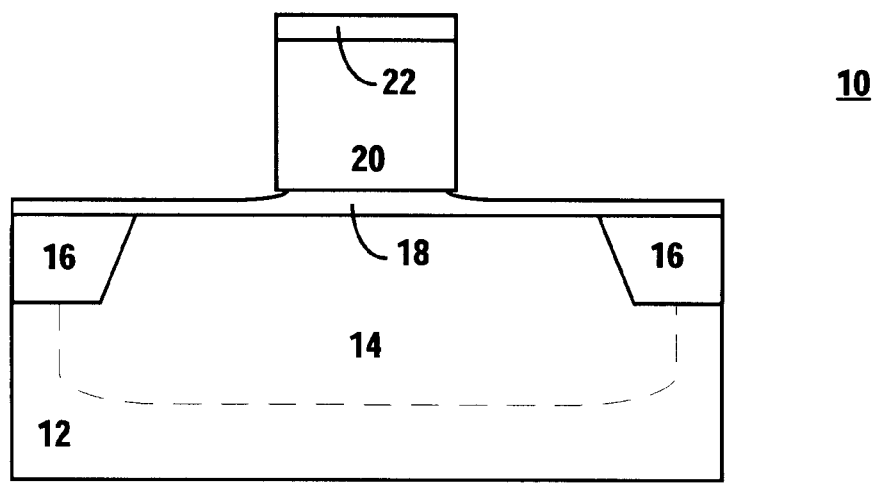
FIG. 3 is a cross sectional view of the integrated circuit of FIG. 2, where the sacrificial layer and the gate electrode layer have been etched and the gate dielectric layer has been cleaned.

FIG. 3 depicts the integrated circuit 10 at a point where both the sacrificial layer 22 and the gate electrode layer 20 have been etched, regardless of whether they were etched in a single process or multiple processes, and the photoresist masking material has been removed from the surface of the sacrificial layer 22. It is noted that the photoresist masking material used to pattern the sacrificial layer 22 may be removed at any one of several different points between the beginning of etching of the sacrificial layer 22 and the end of etching the gate electrode layer 20, depending upon the specific etching techniques selected for the sacrificial layer 22 and the gate electrode layer 20, and the compatibility of the photoresist masking material with those selected etching techniques.

As depicted in FIG. 3, etching the gate electrode layer 20 leaves portions of the gate dielectric layer 18 exposed and other portions of the gate dielectric layer 18 covered. In a most preferred embodiment, the gate dielectric layer 18 is cleaned in some manner prior to further processing. For example, in the embodiment where the gate dielectric layer 18 is formed of silicon oxide, dipping the integrated circuit in an aqueous solution of hydrofluoric acid for a brief length of time will tend to etch a portion of the silicon oxide gate dielectric layer 18. This cleans the surface of the silicon oxide gate dielectric layer 18 by removing any impurities that may be left behind on the surface of the silicon oxide gate dielectric layer 18 from prior processing steps, such as the etches of the sacrificial layer 22 and the gate electrode layer 20.

In a most preferred embodiment, the cleaning of the gate dielectric layer 18 is conducted so as to remove between about zero angstroms and about fifty angstroms, and most preferably about ten angstroms of the thickness of the gate dielectric layer 18. The hydrofluoric acid solution is preferably at room temperature, which is about twenty-one centigrade.

Cleaning the gate dielectric layer 18 with an isotropic etchant, such as a wet etchant like the hydrofluoric acid solution, tends to undercut the bottom edge of the gate electrode layer 20 to some small degree. The amount of undercutting as depicted in FIG. 3 is greatly exaggerated, so that the undercutting can be detected in the drawing. In alternate embodiments where a highly anisotropic etchant is used to clean the surface of the gate dielectric layer 18, such as a highly directional ion bombardment, the bottom edge of the gate electrode layer 20 tends to not be undercut to any significant degree.

The integrated circuit 10 is exposed to a first species 24 according to a process by which the first species primarily contacts the horizontal surfaces of the integrated circuit 10, and preferentially does not appreciably contact the vertical surfaces of the integrated circuit 10. This process is exemplified in FIG. 4. For example, the first species is applied using a process such as an accelerated plasma having a zero degree tilt angle. In other words the first species is preferably ionized and accelerated toward the integrated circuit 10 at an angle that is substantially perpendicular to the plane of the integrated circuit 10, as determined by the angle at which the semiconductor substrate 12 is disposed.

The first species is specifically selected so as to inhibit diffusion of oxygen through the gate dielectric layer 18. Preferably, the first species also inhibits diffusion of oxygen through the sacrificial layer 22. In a preferred embodiment, where both the gate dielectric layer 18 and the sacrificial layer 22 are formed of silicon oxide, nitrogen is used as the first species. In alternate embodiments where other materials are used to form the gate dielectric layer 18 and the sacrificial layer 22, materials other than nitrogen may be selected, which materials are selected based at least in part upon their compatibility with the other process steps, such as described above and below, and their ability to inhibit diffusion of oxygen through the materials selected to form the gate dielectric layer 18 and the sacrificial layer 22.

The nitrogen is preferably impregnated into the gate dielectric layer 18 and the sacrificial layer 22 to a concentration of between about three atomic percent and about twenty atomic percent, and most preferably about fifteen atomic percent. For example, in a preferred embodiment of the method according to the present invention, and to continue the example introduced above, the gate dielectric layer 18 and the sacrificial layer 22 are exposed to a nitrogen plasma source, which tends to cause the gate dielectric layer 18 and the sacrificial layer 22 to absorb an amount of nitrogen in a nitridation process. The nitridation process converts the silicon oxide material of the gate dielectric layer 18 and the sacrificial layer 22 to a nitridized silicon oxide barrier layer.

In a most preferred embodiment, the gate dielectric layer 18 and the sacrificial layer 22 are not directly exposed to the nitrogen plasma, rather the nitrogen plasma is remote from the substrate 12 and the gate dielectric layer 18 and the sacrificial layer 22 are exposed to the nitrogen ions via a downstream process. This type of process may be accomplished in a chamber such as a DPS reactor manufactured by Applied Materials of Santa Clara, Calif. The process is preferably accomplished at a pressure of between about 0.001 Torr and about 1.0 Torr, and most preferably about 0.1 Torr, with an ion density of between about three atomic percent and about thirty atomic percent, and most preferably about twenty atomic percent. The process is preferably conducted for a period of time of between about two seconds and about ten minutes, and most preferably about thirty seconds. The radio frequency plasma power is preferably set between about two hundred watts and about two thousand watts, and is most preferably set at about one thousand watts. The substrate 10 is biased to provide the preferential acceleration of the ions with a bias of between about zero watts and about fifty watts, and most preferably about ten watts. The temperature at which the nitridation is carried out should stay at or below about 250 centigrade so that neither the apparatus nor the integrated circuits are damaged during processing.

As previously mentioned, the nitrogen is preferably not applied to the exposed vertical faces of the gate electrode layer 20, for reasons as explained in more detail hereafter.

Figure 4:
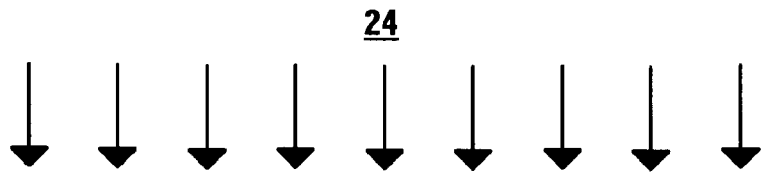
FIG. 4 is a cross sectional view of the integrated circuit of FIG. 3, where an oxygen diffusion inhibiting species is being impregnated.
Figure 4:
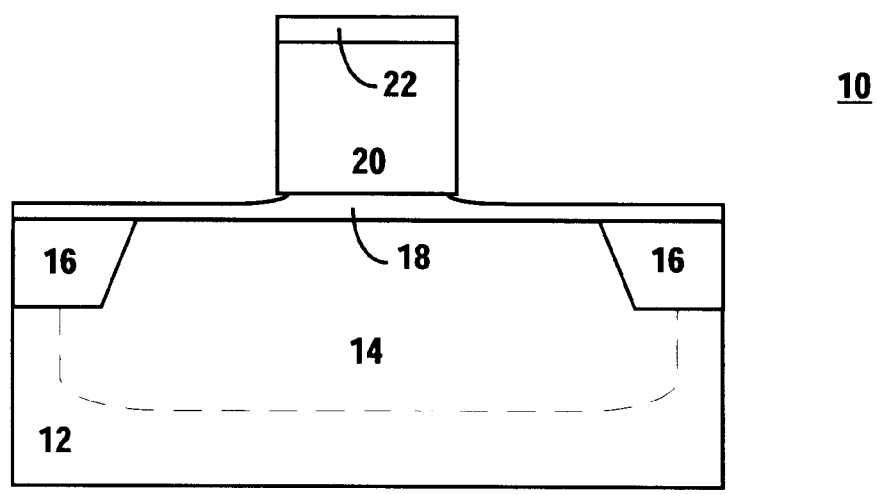

The integrated circuit 10 is exposed to an oxidizing environment. This is preferably accomplished by exposing the integrated circuit 10 to a source of oxygen at an elevated temperature. The environment may be either a wet oxidizing environment, or more preferably a dry oxidizing environment. As depicted in FIG. 4, when the integrated circuit 10 is exposed to the oxidizing environment, it is actually the exposed portions of the gate dielectric layer 18, the exposed vertical faces of the gate electrode layer 20, and the exposed surfaces of the sacrificial layer 22 that are exposed to the oxidizing environment.

Figure 5:
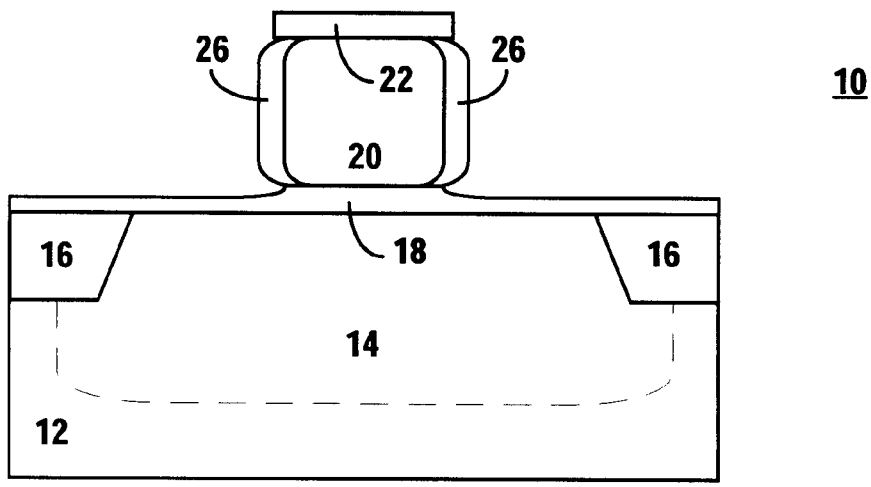
FIG. 5 is a cross sectional view of the integrated circuit of FIG. 4, where oxide sidewalls have been grown on the exposed vertical faces of the gate electrode layer.

The process by which the integrated circuit 10 is exposed to an oxidizing environment is referred to as a reoxidation process. A primary purpose of the reoxidation process is to grow oxide sidewalls 26 on the exposed vertical faces of the gate electrode layer 20, as depicted in FIG. 5.

As explained above, the oxidizing environment tends to encourage the growth of oxides of those materials that form oxides. In the preferred embodiment, where the gate dielectric layer 18 and the sacrificial layer 20 are both formed of silicon oxide, neither the gate dielectric layer 18 nor the sacrificial layer 20 tend to oxidize further. However, in typical processing the oxygen in the oxidizing environment tends to diffuse through the silicon oxide of the both the gate dielectric layer 18 and the sacrificial layer 20 to the silicon material below the respective silicon oxide layers.

For example, the oxygen typically diffuses through the silicon oxide gate dielectric layer 18 to the interface of the silicon oxide gate dielectric layer 18 and the silicon substrate 12. When such diffusion occurs, silicon oxide tends to grow at the interface between the silicon oxide gate dielectric layer 18 and the silicon substrate 12, which effectively increases the thickness of the silicon oxide gate dielectric layer 18. As described above, this growth in the thickness of the silicon oxide gate dielectric layer 18 tends to cause problems with subsequent processes, such as the formation of the source and drain areas of the integrated circuit 10.

As a further example, when oxygen diffuses through the silicon oxide sacrificial layer 22, silicon oxide tends to grow at the interface between the silicon oxide sacrificial layer 22 and the polysilicon gate electrode layer 20, which effectively increases the thickness of the silicon oxide sacrificial layer 22 and decreases the thickness of the polysilicon gate electrode layer 20.

However, impregnating the sacrificial layer 22 and the gate dielectric layer 18 with the first species, which in the preferred embodiment described above is nitrogen, tends to inhibit the diffusion of oxygen through the sacrificial layer 22 and the gate dielectric layer 18, and thereby inhibits formation of oxides with the materials underlying the sacrificial layer 22 and the gate dielectric layer 18.

For example, the impregnation of nitrogen into the silicon oxide gate dielectric layer 18 tends to inhibit the diffusion of oxygen through the silicon oxide gate dielectric layer 18 to the interface with the silicon substrate 12. Thus, no additional oxide tends to grow at the interface between the silicon oxide gate dielectric layer 18 and the silicon substrate 12, because there is substantially no oxygen, or a substantially reduced amount of oxygen, available to generate the oxide growth.

To continue the example, the impregnation of nitrogen into the silicon oxide sacrificial layer 22 tends to inhibit the diffusion of oxygen through the silicon oxide sacrificial layer 22 to the interface with the top surface of the polysilicon gate electrode layer 20. Thus, no additional oxide tends to grow at the interface between the silicon oxide sacrificial layer 22 and the top surface of the polysilicon gate electrode layer 20, because there is substantially no oxygen, or a substantially reduced amount of oxygen, available to generate the oxide growth.

Because no substantial additional amount of oxide is grown during the reoxidation process at the interface between the gate dielectric layer 18 and the semiconductor substrate 12, the gate dielectric layer 18 remains at substantially the same thickness as described above. In this manner, the variations in thickness of the gate dielectric layer 18, at different points across the surface of the semiconductor substrate 12 and at the same point through the processing of the integrated circuit 10, remain at a relatively low level. This in turns allows the subsequently formed source and drain junctions to be placed at a relatively fixed position. This ability to control the source and drain implants to such a fine degree provides some of the control desired to produce a shallow junction integrated circuit 10.

Figure 6:
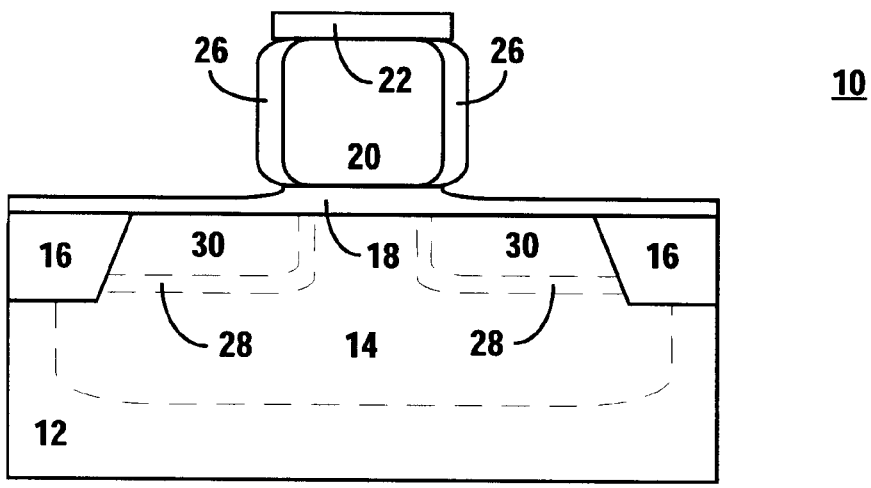
FIG. 6 is a cross sectional view of the integrated circuit of FIG. 5, where the pocket and source/drain implants have been made.

FIG. 6 depicts the integrated circuit 10 after the punch through implants 28 and one of either the lightly doped drain or highly doped drain implants 30 have been performed. Subsequent processing creates the source and drain electrodes, the insulating layers, the electrical contacts between the different integrated circuits 10 on the semiconductor substrate 12, and all the other structures required for a fully operable integrated circuit 10.

The process described above can be modified in various embodiments. For example, as described above the reoxidation step is performed prior to the implant of the second species. In this preferred embodiment, the implanted second species is not subjected to the thermal energy absorbed by the semiconductor substrate 12 during the reoxidation step, which tends to create some amount of unwanted diffusion within the semiconductor substrate 12 by the second species. However, other benefits of the method as explained are retained when the method is performed with the reoxidation and the implant of the second species reversed. For example, the implant of the second species still inhibits subsequent oxide growth at both the gate dielectric layer 18 and the sacrificial layer 22. Because the sacrificial layer 22 does not increase in thickness during the reoxidation, the subsequently performed P+ polysilicon implantation through the sacrificial layer 22 produces more repeatable results, in a manner similar to the benefits as described above in regard to the source/drain implants.

When the method is performed with the reoxidation performed after the second species implant, the reoxidation can be performed for a longer period of time, or with other adjusted processing conditions, so as to form thicker oxide sidewalls on the vertical faces of the gate electrode 20. The thicker oxide sidewalls are referred to as sidewall oxide spacers, and preferably have a thickness of between about one hundred angstroms and about one thousand angstroms, and most preferably about two hundred angstroms.

Although the description above recites that oxide growth occurs on the vertical faces of the gate electrode 20, it is appreciated that, as depicted in FIGS. 5 and 6, some amount of oxide growth also occurs at the outside edges of the interfaces between the gate electrode layer 20 and the sacrificial layer 22 and the gate dielectric layer 18. However, this oxide growth at the outside edges of these interfaces is very limited in comparison to the overall length of these interfaces, and so the discussion above has simplified the description to state that oxide growth occurs at the vertical faces of the gate electrode 20. As described at length above, the implantation of the first species substantially inhibits oxide growth at these interfaces, along a substantial interior portion of the length of these interfaces.

The foregoing description of preferred embodiments for this invention have been presented for purposes of illustration and description. They are not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. An integrated circuit, the improvement comprising junctions in the integrated circuit formed according to a method comprising:

growing a gate dielectric layer on the semiconductor substrate, depositing a gate electrode layer on the gate dielectric layer, forming a sacrificial layer on the gate electrode layer, patterning the sacrificial layer with a material to cover portions of the sacrificial layer and expose portions of the sacrificial layer, etching the exposed portions of the sacrificial layer to remove the exposed portions of the sacrificial layer and expose portions of the gate electrode layer, etching the exposed portions of the gate electrode layer to expose portions of the gate dielectric layer and form a gate electrode having exposed vertical faces, impregnating the sacrificial layer and the exposed portions of the gate dielectric layer with a first species that inhibits diffusion of oxygen through the sacrificial layer and the exposed portions of the gate dielectric layer, using a process that does not impregnate a significant amount of the first species in the exposed vertical faces of the gate electrode, impregnating a second species through the impregnated exposed portions of the gate dielectric layer into portions of the semiconductor substrate that underlie the impregnated exposed portions of the gate dielectric layer to form junctions in the portions of the semiconductor substrate that underlie the impregnated exposed portions of the gate dielectric layer, and exposing the impregnated sacrificial layer, the exposed vertical faces of the gate electrode, and the impregnated exposed portions of the gate dielectric layer to an oxidizing environment, causing oxide growth on at least the exposed vertical faces of the gate electrode and thereby covering the vertical faces of the gate electrode with sidewall oxide spacers, but not causing significant oxide growth under the impregnated sacrificial layer and the impregnated exposed portions of the gate dielectric layer.

2. An integrated circuit, the improvement comprising junctions in the integrated circuit formed according to a method comprising:

growing a gate dielectric layer on the semiconductor substrate, depositing a gate electrode layer on the gate dielectric layer, forming a sacrificial layer on the gate electrode layer, patterning the sacrificial layer with a material to cover portions of the sacrificial layer and expose portions of the sacrificial layer, etching the exposed portions of the sacrificial layer to remove the exposed portions of the sacrificial layer and expose portions of the gate electrode layer, etching the exposed portions of the gate electrode layer to expose portions of the gate dielectric layer and form a gate electrode having exposed vertical faces, impregnating the sacrificial layer and the exposed portions of the gate dielectric layer with a first species that inhibits diffusion of oxygen through the sacrificial layer and the exposed portions of the gate dielectric layer, using a process that does not impregnate a significant amount of the first species in the exposed vertical faces of the gate electrode, exposing the impregnated sacrificial layer, the exposed vertical faces of the gate electrode, and the impregnated exposed portions of the gate dielectric layer to an oxidizing environment, causing oxide growth on at least the exposed vertical faces of the gate electrode and thereby covering the vertical faces of the gate electrode with oxide sidewalls, but not causing significant oxide growth under the impregnated sacrificial layer and the impregnated exposed portions of the gate dielectric layer, and impregnating a second species through the impregnated exposed portions of the gate dielectric layer into portions of the semiconductor substrate that underlie the impregnated exposed portions of the gate dielectric layer to form junctions in the portions of the semiconductor substrate that underlie the impregnated exposed portions of the gate dielectric layer.

3. An integrated circuit, the improvement comprising junctions in the integrated circuit formed according to a method of forming oxide sidewalls on exposed vertical sidewalls of a gate electrode without forming additional oxide on a top of the gate electrode or on active areas of a semiconductor substrate on which the gate electrode is disposed, the method comprising:

growing a gate dielectric layer on the semiconductor substrate, depositing a gate electrode layer on the gate dielectric layer, forming a sacrificial layer on the gate electrode layer, patterning the sacrificial layer with a material to cover portions of the sacrificial layer and expose portions of the sacrificial layer, etching the exposed portions of the sacrificial layer to remove the exposed portions of the sacrificial layer and expose portions of the gate electrode layer, etching the exposed portions of the gate electrode layer to expose portions of the gate dielectric layer that overly the active areas of the semiconductor substrate, and also to form the gate electrode and the exposed vertical faces of the gate electrode, impregnating the sacrificial layer and the exposed portions of the gate dielectric layer with a first species that inhibits diffusion of oxygen through the sacrificial layer and the exposed portions of the gate dielectric layer, using a process that does not impregnate a significant amount of the first species in the exposed vertical faces of the gate electrode, exposing the impregnated sacrificial layer, the exposed vertical faces of the gate electrode, and the impregnated exposed portions of the gate dielectric layer to an oxidizing environment, causing oxide growth on at least the exposed vertical faces of the gate electrode and thereby covering the vertical faces of the gate electrode with oxide sidewalls, but not causing significant oxide growth under the impregnated sacrificial layer, and the impregnated exposed portions of the gate dielectric layer that overly the active areas of the semiconductor substrate, and impregnating a second species through the impregnated exposed portions of the gate dielectric layer into the active areas of the semiconductor substrate that underlie the impregnated exposed portions of the gate dielectric layer to form junctions in the portions of the semiconductor substrate that underlie the impregnated exposed portions of the gate dielectric layer.

* * * * *